United States Patent
Feeney

(10) Patent No.: US 9,793,672 B2
(45) Date of Patent: Oct. 17, 2017

(54) COMPOSITE LAMINATE HAVING A FLEXIBLE CIRCUIT BRIDGE AND METHOD OF MANUFACTURE THEREOF

(75) Inventor: Christopher John Feeney, Wallingford, CT (US)

(73) Assignee: GKN Aerospace Services Structures Corp., Cromwell, CT (US)

(*) Notice: Subject to any disclaimer, the term of this patent is extended or adjusted under 35 U.S.C. 154(b) by 1043 days.

(21) Appl. No.: 14/005,067

(22) PCT Filed: Mar. 16, 2012

(86) PCT No.: PCT/US2012/029420
§ 371 (c)(1),
(2), (4) Date: Nov. 21, 2013

(87) PCT Pub. No.: WO2012/125919
PCT Pub. Date: Sep. 20, 2012

(65) Prior Publication Data
US 2014/0078693 A1 Mar. 20, 2014

Related U.S. Application Data

(60) Provisional application No. 61/453,296, filed on Mar. 16, 2011.

(51) Int. Cl.
*H01R 43/20* (2006.01)
*H05B 3/06* (2006.01)
(Continued)

(52) U.S. Cl.
CPC ........... *H01R 43/20* (2013.01); *H01R 12/592* (2013.01); *H05B 3/06* (2013.01); *H05B 3/34* (2013.01);
(Continued)

(58) Field of Classification Search
CPC ........ H01R 43/20; H01R 12/50; H01R 12/58; H01R 12/59; H01R 12/592; H01R 12/594;
(Continued)

(56) References Cited

U.S. PATENT DOCUMENTS 3,657,516 A * 4/1972 Fujihara ............... B65D 88/744
219/213
4,121,088 A 10/1978 Doremus et al.
(Continued)

FOREIGN PATENT DOCUMENTS

EP 0 680 878 A1 11/1995
GB 2 291 575 A 1/1996

OTHER PUBLICATIONS

International Search Report and Written Opinion under dated Jul. 5, 2012 in connection with PCT/US2012/029420.

*Primary Examiner* — Gregory Anderson
*Assistant Examiner* — Danielle M Christensen
(74) *Attorney, Agent, or Firm* — Bejin Bieneman PLC

(57) ABSTRACT

In a composite component having a laminate body, a conductive layer and a connector can be joined to one another using an intermediate flexible circuit. Among other things, this flexible circuit places the conductive layer and the connector in electrical communication with one another. Furthermore, during the forming process and because of its thinness, the flexible circuit integrates well with the layers of the laminate body and can accommodates some spatial displacement of the connector and conductive material relative to one another.

20 Claims, 4 Drawing Sheets

(51) Int. Cl.
- *H05K 1/14* (2006.01)
- *H05B 3/34* (2006.01)
- *H01R 12/59* (2011.01)
- *B64D 15/12* (2006.01)
- *H05K 1/02* (2006.01)
- *H05K 1/11* (2006.01)
- *H05K 1/16* (2006.01)

(52) U.S. Cl.
CPC ............ *H05K 1/147* (2013.01); *B64D 15/12* (2013.01); *H05B 2203/013* (2013.01); *H05K 1/0284* (2013.01); *H05K 1/118* (2013.01); *H05K 1/167* (2013.01); *H05K 2201/0999* (2013.01); *H05K 2201/09481* (2013.01); *H05K 2201/10295* (2013.01); *Y10T 156/10* (2015.01)

(58) Field of Classification Search
CPC ...... H01R 12/51; H01R 12/515; H01R 12/61; H05B 3/34; H05B 3/06; H05B 2203/013; H05K 1/118; H05K 2201/09481; H05K 1/0284; H05K 2201/0999; H05K 1/167; H05K 2201/10295; F03D 80/40; F03D 80/60; F03D 80/00; F03D 80/30; B29C 35/0272; B29C 5/34; B29C 5/8276; B29C 70/882; B29C 70/885; B29C 61/0625; B64D 15/12; B23K 1/0016; B23K 1/0018; B23K 2201/001; B23K 2201/36–2201/42

See application file for complete search history.

(56) References Cited

U.S. PATENT DOCUMENTS

| | | | |
|---|---|---|---|
| 4,245,149 A * | 1/1981 | Fairlie | H05B 1/0272 219/494 |
| 5,947,418 A | 9/1999 | Bessiere et al. | |
| 7,183,891 B2 * | 2/2007 | Harris | H01C 7/12 338/204 |
| 7,656,674 B2 | 2/2010 | Wetzel et al. | |
| 2002/0019154 A1 | 2/2002 | Na | |
| 2002/0153368 A1 * | 10/2002 | Gardner | B29C 70/82 219/545 |
| 2003/0143871 A1 | 7/2003 | Sanada et al. | |

* cited by examiner

COMPOSITE LAMINATE HAVING A FLEXIBLE CIRCUIT BRIDGE AND METHOD OF MANUFACTURE THEREOF

CROSS-REFERENCE TO RELATED APPLICATIONS

This application represents the national stage entry of PCT International Application No. PCT/US2012/029420 filed on Mar. 16, 2012 and claims the benefit of U.S. provisional patent application No. 61/453,296 filed Mar. 16, 2011. The contents of both of these applications are is hereby incorporated by reference as if set forth in their entirety herein.

BACKGROUND

This disclosure relates to composite laminates with one or more embedded layers and an improved manner of connecting a connector to the embedded layer or layers.

Composite components, such as laminates, are often used in applications in which having a high strength-to-weight ratio is important such as, for example, aerospace applications. Many structural composite components can be made by layering a high-strength fabric over a form to create what is known as a fabric preform, applying a resin to the fabric preform, and then curing the resin to lock the fabric in place, thereby forming the final composite component.

In some instances, to provide additional functionality to a laminate, one or more non-fabric layers can be embedded between the fabric layers of a laminate. As one example, a metallic layer might be placed between two of the fabric layers for use as an in-situ resistive heating element. As another example, a layer containing sensors could be placed within the laminate in order to measure the loads imparted on the laminate and to detect any structural weakening of the component so that the component can be taken out of service if needed.

SUMMARY OF THE INVENTION

Because of the fabrication steps used to form laminate composites with embedded layers, it has been particularly problematic to efficiently manufacture such components with connectors for connecting the internally embedded layers or circuit portions to external circuits or electrical devices.

When a layer is to be embedded in the laminate, the embedded layer must be placed or otherwise formed during the construction of the laminate. This usually means that the embedded layer is placed before the fabric of the laminate is fully laid, and in some instances, also before the resin has been fully injected and cured. During the application and curing of the resin, the laminate can, at least to some non-trivial extent, exhibit a dimensional change. This makes a direct connection of any embedded layers to the connector potentially problematic because stress may develop at the connection between the embedded layer and the connector during the curing of the resin and compromise the integrity of the connection.

Alternatively, the connection between the connector and the embedded layer might be established after curing. However, this type of production can be particularly labor-intensive because the connector would need to be assembled in-place with the as-cured laminate already having been formed.

As still a further consideration, the use of internal wires or other custom detailing in the laminate body to permit external connection is typically problematic. Among other things, such features are not easily received between the layers and can either complicate the fabrication process or result in the formation of undesired wrinkles or bulges in the fabric above the locations at which the features are embedded.

These problems and more have been overcome in this disclosure by the use of a flexible circuit to bridge an electrical connection between an embedded internal conductive layer or layers and a connector. Among other things, the thinness of the flexible circuit means that the flexible circuit integrates well with traditional laminate forming processes.

According to one aspect of the invention, a composite component includes a laminate body, a connector, and a flexible circuit. The laminate body includes a plurality of layers held together by a resin. In the composite component, an opening is formed into which the connector is received. The conductive layer is disposed between the layers of the laminate body such that the conductive layer can be said to be embedded in the laminate body. The flexible circuit bridges the connector and the conductive layer thereby placing the connector in electrical communication with the conductive layer. At least a portion of an electrical circuit is established between the connector, the flexible circuit, and the conductive layer.

The flexible circuit may be disposed between the layers of the laminate body and may be flexible during a curing process in which the resin of the laminate body is hardened to form the composite component. By providing some amount of resilience and behaving similar to a flexible ply, the flexible circuit can accommodate some amount of spatial displacement of the connector and the conductive layer relative to one another during curing. This avoids the need to use special custom-molded conductors and/or perform in-place assembly of the connector in the cured composite component.

The flexible circuit may include two or more conductive traces which are each connected to respective pins in the connector. Each one of the conductive traces can electrically connect one of the pins on the connector to a respective portion of the conductive layer. The connection between the flexible circuit and the connector and conductive layer could be made, for example, by welding or soldering. The connector may have an attachment end that is connected to the flexible circuit (e.g., by the aforementioned welding and/or soldering) and a plug end that is accessible from an exterior of the composite component.

In one preferred form, the plurality of layers of the laminate body may be a carbon fiber fabric and be held together, at least in part, by a cured resin material. Because the carbon fiber fabric layers are electrically conductive, the flexible circuit and the conductive layer embedded in the laminate body can have electrically insulative material disposed between the layers of the laminate body and the conductive layer and/or the flexible circuit.

In some forms, the composite component may include a core, such as a metallic core, over a portion of which the plurality of layers of the laminate body are placed. The opening that receives the connector may be formed in the core, while the conductive layer may be disposed between the layers of the laminate body. However, in other forms, the entire composite component could be a laminate (with the embedded conductive layer, flexible circuit, and connector).

The conductive layer might serve one of a number of functions. In one form, the conductive layer may be a heater element that is used, for example, to deice airfoil surfaces of the composite component. In another form, the conductive layer may be adapted to monitor a structural health of the laminate body using embedded sensors or other detection means.

Although the composite component could be used in any of a number of different types of applications, such composite components may be particularly useful in the aerospace industry. For example, the composite component could be an engine vane or part of an airfoil. In one specific embodiment in which the composite component is an engine vane, the opening for the connector may be formed in a platform portion of the composite component adapted for connection to an engine case and the conductive material may be formed in an airfoil portion of the composite component.

According to another aspect of the invention, a method of making a composite component of this type is provided. The method includes laying at least some of the plurality of layers to form a portion of the laminate body. At this point, a conductive layer and a flexible circuit can be placed in the laminate body and a connector placed in the composite component (e.g., either in another portion of the laminate body or in a core having a portion over which the laminate body is formed). The flexible circuit bridges the conductive layer and the connector and further places the connector in electrical communication with the conductive layer. The remainder of the plurality of layers can then be laid to embed the conductive layer and the flexible circuit bridge within the laminate body. Then, the resin can be cured that holds the plurality of layers together to form the composite component.

Again, during the curing process, the flexible circuit can accommodate some spatial displacement of the connector and conductive material relative to one another.

The method may further include the step of injecting the resin into the plurality of layers before curing. However, it is contemplated that the layers of the laminate body may be pre-impregnated with resin, meaning that a separate injection step is not needed, or that resin might be introduced at multiple times throughout the forming of the composite component and not fully cured until the end of the process.

In order to establish a solid electrical and mechanical connection across the connector, flexible circuit, and the conductive material, the flexible circuit may be welded or soldered to the connector and the conductive layer.

The method may further include the steps of forming an opening in the composite component before laying the remainder of the plurality of layers and inserting the connector in the opening. In some forms, the composite component may include a core, such as a metallic core, and the step of laying at least some of the plurality of layers to form a portion of the laminate body includes placing the layers over the core. Additionally, the opening for the connector may be formed in the core while the conductive layer is disposed between the layers of the laminate body. In this instance, the flexible circuit will bridge the parts disposed in the core and the laminate body portions of the composite component.

These and still other advantages of the invention will be apparent from the detailed description and drawings. What follows is merely a description of some preferred embodiments of the present invention. To assess the full scope of the invention the claims should be looked to as these preferred embodiments are not intended to be the only embodiments within the scope of the claims.

DETAILED DESCRIPTION

Figure 1:
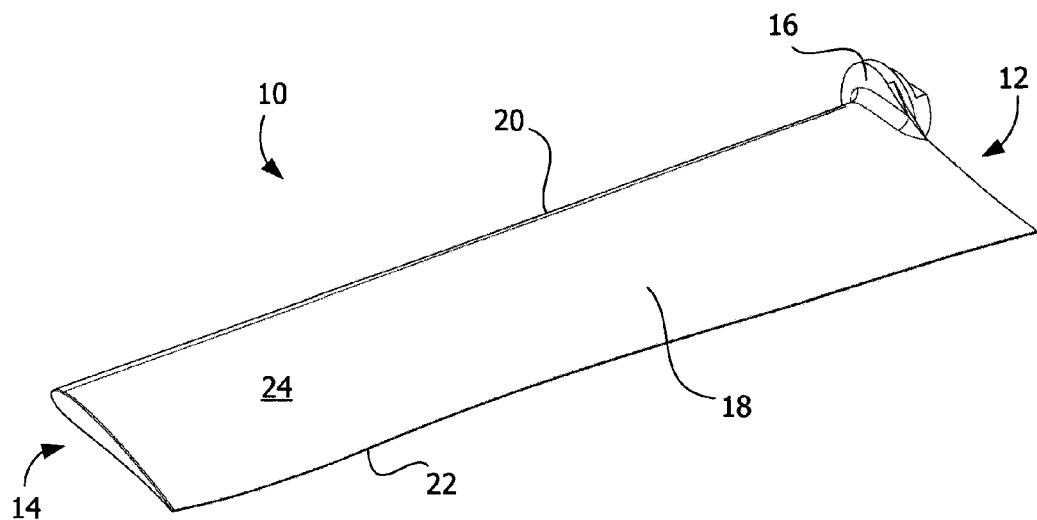
FIG. 1 is a perspective view of a composite component in the form of an engine vane.
Figure 2:
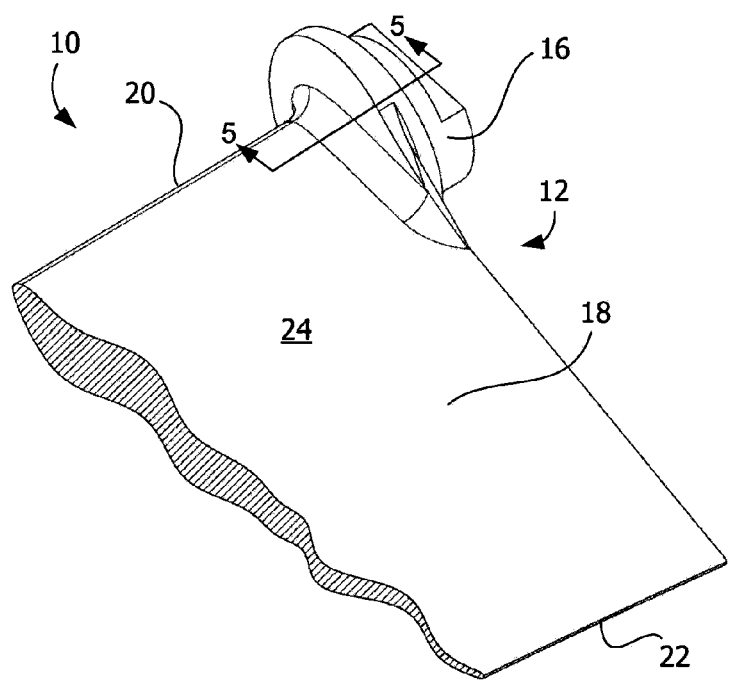
FIG. 2 is a detailed view of an end of the vane of FIG. 1 showing the platform portion.

Referring first to FIGS. 1 and 2, a composite component 10 is illustrated in the form of an engine vane which may be used, for example, in an turbo engine of an aircraft. Given the application, such a composite component 10 is a structural component that is stiff and rigid.

The composite component 10 extends from a first end 12 for connection to a central case or an outer case (not shown) to a second end 14. The first end 12 includes a platform portion 16 which can be adapted for reception in the case and may include mounting features that interact with the case to secure the two together (e.g., a slot and tongue engagement of the two parts) and/or features that enable connection of the two parts via fastening means (e.g., threaded holes for engagement with bolts). As will be described in greater detail below, the platform portion 16 on this first end 12 also supports a connector (not shown in FIGS. 1 and 2), which can be used to electrically connect internal components of the composite component 10 to an electrical system, monitoring equipment, and/or a power supply. As illustrated, the second end 14 is a terminal end; however, the second end 14 could be made to include a feature that engages another circumferential element of the turbo engine to provide further structural support for the composite component 10 during use.

Between the first end 12 and the second end 14, the composite component 10 primarily includes a vane 18, which serves as an airfoil. This vane 18 has a leading edge 20 and a tailing edge 22 along with a airfoil surface 24 there between. The shape of leading edge 20, tailing edge 22, and the airfoil surface 24 can be used to control the manner in which air or another gas interacts with the surfaces and edges of the vane 18.

Figure 3:
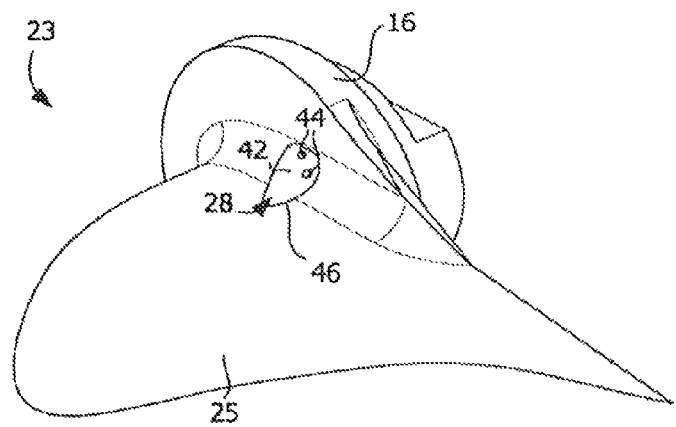
FIG. 3 is a detailed view of a core portion of the composite component of FIG. 1 before the laminate layers have been laid.

With further reference to FIG. 3, a core 23 is illustrated. This core 23 may be a metallic core that is formed into shape using any of a number of metal fabricating processes (e.g., casting, machining, forging, and so forth). The core 23 includes the platform portion 16 as well as an integral paddle portion 25. The paddle portion 25 is a relatively slender section that is roughly perpendicular to a generally circular face of the platform portion 16. At a radius between the platform portion 16 and the paddle portion 25, an opening 46 is formed in the platform portion 16 of the core 23. During assembly (as will be described in more detail below), the layers of fabric can be placed over the paddle portion 25 to form the vane 18 and the connector 28 may be placed into the opening 46.

Figure 4:
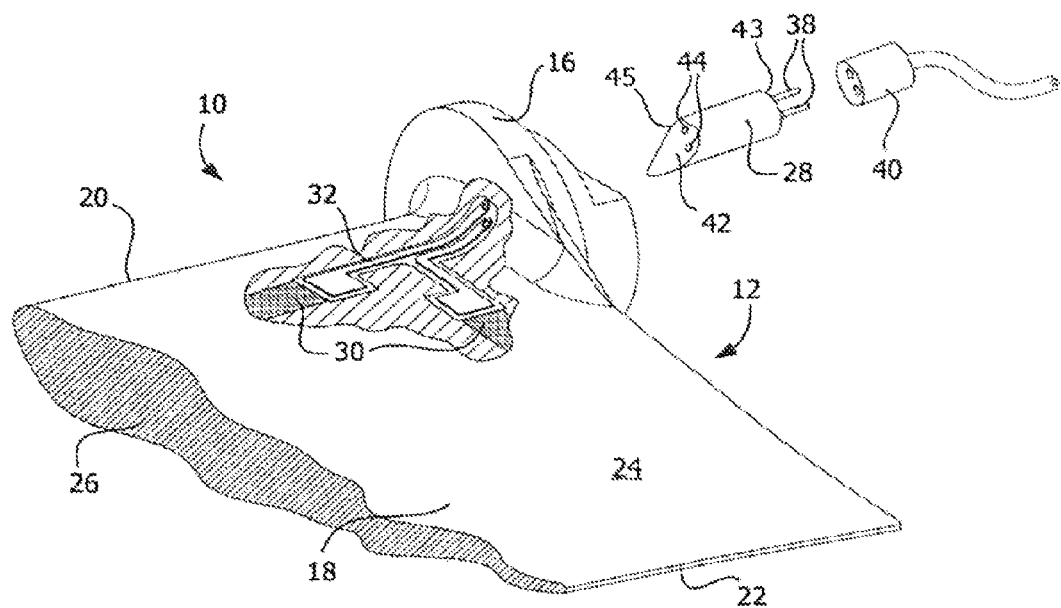
FIG. 4 is a detailed, partially exploded, partial break away perspective view of the vane of FIG. 1.
Figure 5:
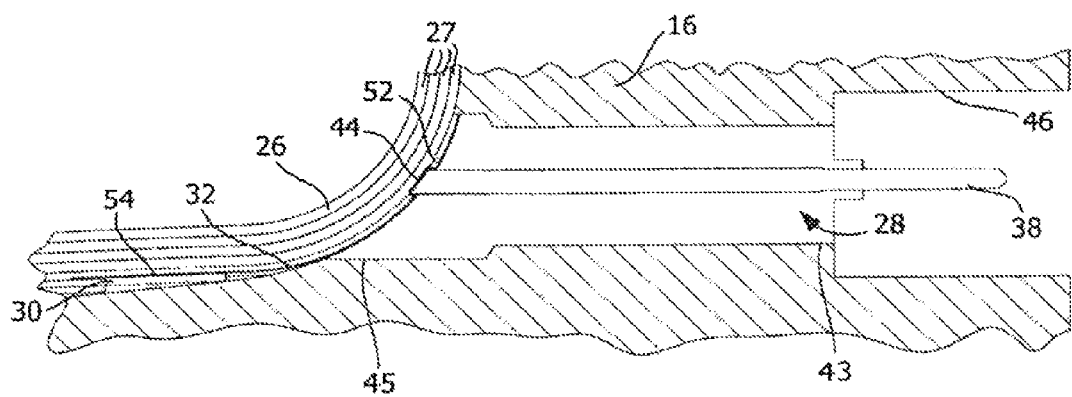
FIG. 5 is a cross sectional view taken through line 5-5 of FIG. 2 illustrating the connector and flexible circuit embedded in the laminate body of the composite component.

Now with additional reference to FIGS. 4 and 5, partial interior views of the composite component 10 are illustrated. From these views, it can be seen that the composite component 10 includes a laminate body 26 which supports or houses various elements in the laminate body 26 of the composite component 10. Among these elements are a conductive layer 30 and a flexible circuit 32 which bridges and electrically connects the connector 28 to the conductive layer 30.

The laminate body 26 comprises including a plurality of layers 27 of fabric, which are best illustrated in the detail of FIG. 5, held together by a resin material throughout. The resin material is cured to harden the laminate body 26 and lock the layers 27 of fabric in place with respect to one another. It should be appreciated that a number of layers 27 are roughly depicted as being stacked upon one another in FIG. 5; however, in reality for complex shapes it is often the case that layers of fabric may not be completely continuous and to obtain complex geometric features (for example, the platform portion 16 if the platform portion 16 were to be part of the laminate), the fabric or sections thereof may need to be selectively cut and applied and, in some instances, interleaved with other layers. For the sake of clarity, the cross-hatching of FIG. 4 is not intended to illustrate layer orientation, but to indicate a break in the illustrated view.

Because aircraft components are preferably made from a material possessing a high strength-to-weight ratio, the fabric of the layers 27 may be made of a carbon fiber material and the resin may be an epoxy or a high-temperature resin such as bismaleimide or polyamide to make an extremely strong and rigid component that is stable at high temperatures. Typically, the carbon fiber fabric is a woven material made from various tows of the material that are woven. Often the material in the form of a tri-axial weave in which the fabric includes axial tows as well as two pairs of bi-axial tows oriented in at a positive or negative angle relative to axial tows (typically, plus and minus 60 degrees from the orientation of the axial tows). However, nothing should so limit the disclosed composite component to this specific fabric type or arrangement. Other fabrics and resin material might be used depending on the demands of the application. Likewise, the fabric may be non-woven, have other weave patterns, or possess structurally modified tows.

Figure 7:
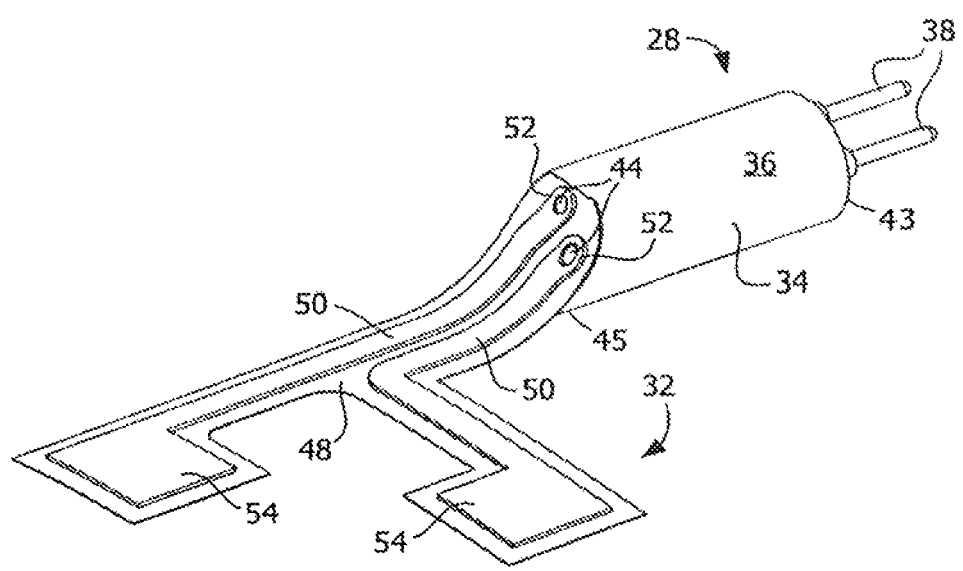
FIG. 7 is a detailed view of the flexible circuit of FIG. 6, further showing the attachment of the connector to one end of the flexible circuit.

Returning now to the electrical elements captured in the composite component 10, and with further reference to FIG. 7, the connector 28 includes a body 34 having a generally cylindrically-shaped outer surface 36. On one end of the body 34 of the connector 28, there are a pair of pins 38 which project out of the end of the body 34 in a direction parallel to the axis of the connector 28. This end of the body 34 and the pins 38 are accessible from the outside of the laminate body 26 of the composite component 10 such that connector 28 can be attached to another connector, such as the harness 40 which is illustrated in FIG. 4. This harness 40 can be wired to connect to an electrical system, monitoring system, power supply or so forth. On the other end of the body 34, there is curved surface 42 (best illustrated in FIGS. 3 and 4) through which rear stubs 44 of the pins 38 exit. As will be described in further detail below, during assembly, a portion of the flexible circuit 32 is placed against this curved surface 42 on the attachment end of the connector 28 and the rear stubs 44 of the pins 42 can be welded, soldered, or otherwise connected to the flexible circuit 32.

Although only two pins are shown in the illustrated embodiment, which is sufficient to establish a circuit between the connector 28 and the items to which it is attached, it is contemplated that the connector 28 could include more than two pins. Likewise, different types of electrical connection members could be used instead of pins.

With specific reference to FIG. 5, it can be seen that the connector 28 is received in an opening 46, such as a dual counterbored opening, that is formed in the laminate body 26. More particularly, this opening 46 is formed in the platform portion 16 on the side of the platform portion 16 that is connectable to the case. The opening 46 extends into the laminate body 26 and eventually terminates at the location at which the connector 28 is connected to the flexible circuit 32 on the curved surface 42. As will be described in further detail below, the opening 46 may be formed when the laminate body 26 is only partially formed and not all plies or layers 27 of the fabric material have been applied. Moreover, it is contemplated that the platform portion 16 could be first formed as a subassembly into which the opening is formed and that this subassembly could be subsequently attached the vane 18. Accordingly, the closed end of the opening 46 may be established only once further fabric layers 27 are applied on the side of the opening 46 that generally faces the vane 18.

Figure 6:
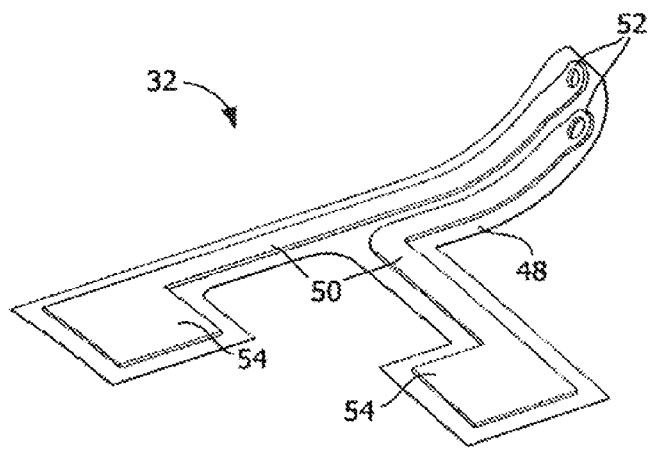
FIG. 6 is a detailed view of the flexible circuit of the composite component in FIG. 1 apart from the remainder of the component.

With additional reference to FIG. 6, the flexible circuit 32 is illustrated in detail and separate from the other elements. The flexible circuit 32 includes a substrate 48, which may be made of a thin flexible plastic material or the like, on which at least two conductive traces 50 are supported. These separate conductive traces 50 may be made of an elastically or plastically deformable thin metal film that is, at least to some significant degree, deformable with the substrate 48, so that the flexible circuit 32 remains operable (that is the traces 50 can continue to conduct a signal or current) over some range of deformation of the flexible circuit 32.

Each of the conductive traces 50 have an attachment end 52 on the portion of the flexible circuit 32 that comes into contact with the mating end of the connector 28. In the particular form illustrated, the attachment ends 52 of the flexible circuit 32 have small openings or apertures which can be placed around the rear stubs 44 of the pins 38 and then welded or soldered into place to establish an electrical connection between the two.

Each of the conductive traces 50 extend to a connection pad 54 at the other end of the conductive trace 50. Unlike the attachment ends 52 which are joined to the connector 28 and which are spatially very close to one another, the connection pads 54 are relative spaced apart from one other, giving the flexible circuit 32 a roughly T-shape form (although other shapes might also be formed). The connection pads 54 are sized and disposed such that they can be connected to the conductive layer 30 in the laminate body 26 by welding, soldering, or another form of electro-mechanical connection.

The conductive layer 30 is embedded within the laminate body 26 between the layers 27 of fabric and resin. This conductive layer 30 may be placed between the layers 27 of the laminate body 26 during fabrication of the composite component 10 between the application of the layers 27 of the fabric material. There are a number of ways that such a conductive layer 30 might be formed including, but not limited to thermal spraying or deposition, cutting the conductive layer 30 from a larger sheet and placing it between the layers 27, and so forth.

Regardless of the specifics of the formation of the conductive layer 30, the conductive layer 30 should be structured as to form a portion of a circuit between the connection pads 54. In the form shown, this means one part of the conductive layer 30 is attached to one of the connection pads 54 and another part of the conductive layer 30 is attached to the other of the connection pads 54 as best illustrated in FIG. 4. Between these two points of connection, the conductive layer 30 can snake through the vane 18 of the laminate body 26 such that a current or other electrical signal can travel into one of the pins 38 of the connector 28, through one of the conductive traces 50 in the flexible circuit, into and through the conductive layer 30, back into and through the other conductive trace 50 in the flexible circuit 32, and out of the other pin 38 in the connector 28.

The transmission of an electrical signal or a current through the conductive layer 30 can serve a number of functions. For example, the transmission of a current through the conductive layer 30 can generate resistance within the conductive layer 30 such that the conductive layer 30 acts as a heater to warm the composite component 10 and the airfoil surfaces thereof. Likewise, the conductive layer 30 could be made to include one or more sensors such as, for example, piezoelectric sensors, that detect and/or monitor the health of the composite component 10 at various locations within the laminate body 26. While these two enumerated functions are illustrative, other functions might also be performed using the conductive layer.

It will be appreciated that electrically isolating layers may sandwich the conductive portions of this circuit to prevent shorting of the circuit within the laminate body 26. Particularly when the fabric material of the laminate body 26 is a carbon fiber material, which is electrically conductive, it is important to isolate the current carrying members of the circuit from the rest of the laminate body 26. This may be achieved by placing layers of an insulative or dielectric material above and below the conductive layer 30 and/or the flexible circuit 32. Additionally or alternatively, the flexible circuit 32 may be fabricated such that the conductive traces 50 are isolated from the laminate body 26 when the attachment of the flexible circuit 32 to the conductive layer 30 and the connector 28 is complete.

While a conductive layer and a circuit in the singular has been described, that the describe arrangement can be extended to include multiple circuits (which may include the duplication of the some of the parts such as pins, conductive traces and so forth), or the conductive layer could be extended to extend between through layers of the laminate by controlling the manner in which the conductive layer or layers and the laminate body are assembled. Moreover, the composite component 10 might be made to include multiple circuits which have the same or different uses or circuits which are capable of more than one use.

Having described the structure above for the composite component 10, it should be appreciated that the inclusion of a flexible circuit 32 provides many advantages. One of the greatest advantages is that the flexible circuit 32 provides an intermediate element which is somewhat flexible and resilient between the conductive layer 30 and the connector 28. In contrast to rigid constructions in which the connector 28 might be directly connected to the conductive layer 30, the flexible circuit 32 provides a bridge which accommodates some spatial movement of the conductive layer 30 relative to the connector 28 during, for example, curing in which slight dimensional changes may occur or other steps in joining sub-assembled sections of the composite component. Accordingly, during assembly, the flexible circuit 32 can behave similar to a layer of the laminate that is laid and does not require special accommodations in its placement.

Some exemplary methods of manufacturing the composite component are now described to aid in an understanding of the benefit of the resultant structure. While these exemplary methods explain the process steps that may be used to fabricate the composite component 10, modifications or additions to these steps can be made.

Initially, to form a composite component 10 of the type described above, layers 27 of a fabric material can be laid to establish a portion of the laminate body 26. In some instances, such as to construct the composite component 10 as illustrated in the figures, these layers 27 may be placed over the paddle portion 25 of the core 23.

In some forms of the method, the platform portion 16 and vane 18 might be initially formed separately as one or more sub-assemblies and then joined. As one example, the platform portion 16 may be formed by taking generally circular layers of fabric and stacking them to form at least part of the platform portion 16 of the composite component 10. During the formation of the platform section 16, at least some of the layers may have sections cut off to form flats or other structural features of the platform portion 16. Likewise, layers 27 of fabric could be wrapped around a mandrel which defines the shape of the vane 18 to establish another portion of the laminate body 26. Typically, the layers 27 of the fabric closest to the center of the vane 18 are laid first along with the layers 27 of the fabric that form the platform 16 or the "core" of the part.

When formed separately as multiple laminates, at some point during the assembly process, the layers of the vane 18 and the platform portion 16 may be made to interleave with one another. This can help to establish a firm structural connection between the two components rather than an unsupported interface.

In other forms of the method, the platform portion 16 and the vane 18 might be built up as one continuous form. Whether the fabric parts are formed as separate joined sub-assemblies or are made as a single form can depend on the geometry of the parts being formed as well as their final mechanical requirements.

It should be noted that when a mandrel is used, the center of the final composite component 10 may include a hollow volume where this mandrel was located. This hollow space is not depicted in the figures. When a core 23 is used, the paddle portion 25 may occupy a portion of the vane 18 of the composite component 10.

At this point, with the fabric partially laid, the internal elements of the circuit can be installed into the partially-formed laminate body. Typically, this involves forming the opening 46 in the platform portion 16 by drilling (or broaching in the event the profile of the connector is not circular, which can help orient the connector in the opening) and then placing the connector 28 in the opening 46. In some instances, it may be most efficient to join the connector 28 to the flexible circuit 32 into a sub-assembly (similar to what is shown in FIG. 7) prior to inserting the connector 28 into the opening 46 rather than first inserting the connector 28 and then attempting to join it to the flexible circuit 28 to form the opening 28 before any fabric material is placed over the core 23.

Likewise, with the vane 18 partially formed, the conductive layer 30 is formed or placed on top of the partially-laid layers 27 of the fabric on the vane 18. As indicated above, application of this conductive layer might include thermally spraying, cutting a form from a thin sheet and putting this form into place, placing wires and sensors throughout on the exposed surface, and so forth. The flexible circuit 32 can then be connected or joined to the conductive layer 30 (and the connector 28, if it has not already been done). Again, this could be done in any number of ways, but soldering and welding are typical ways that such a connection might be made to ensure good electrical transmission through the point of connection.

Again, as noted above, in many circumstances, to avoid a short circuit the conductive portions of the circuit may need to be electrically isolated form the rest of the laminate body 26. Electrically isolating layers may be applied before and after application of the internal elements to properly ensure such isolation.

In some forms of the method, to better permit formation of the opening 46 by machining, the partially-formed laminate body 26 may have some amount of resin introduced and partially cured in the platform portion 16 before the machining occurs to form the opening 46 and perhaps even while the platform portion 16 is still separate from the vane 18. The introduction of this partially-cured resin can improve the machineablity of the material to permit introduction of the connector 28 and may be fully cured later in the process. Where the opening 46 is formed in a separate core 23 that is made of a easily-machined material, such as aluminum, no special preparation may be necessary.

Additionally, in some forms of the method, the placement of the conductive layer 30 on the vane 18 may be made by temporarily pausing the application of the fabric by automated machinery and then restarting the automated fabric placement once the conductive layer 30 has been applied.

In any event, once the elements of the circuit are put into place, the remainder of the layers 27 of fabric can be fully laid. This effectively embeds the elements of the circuit in the laminate body 26 (and the core 23), with the exception of the exposed end of the connector 28.

It is contemplated that in some forms of the method various conductive layers may be applied. If this is the case, then portions of the flexible circuit 32 may remain accessible during intermediate laying of fabric and subsequently joined to another conductive layer later in the process.

Throughout this process, the partially-formed or completely formed laminate body may be debulked to reduce or eliminate wrinkles and ensure tight consolidation of the layers of fabric. The strength of the composite component is primarily derived from the fabric layers of the material and not the resin material. For this reason, it is desirable to have high fabric-to-resin ratio in the volume of the composite component which can be achieved by dense placement of the fabric.

At this point, the consolidated fabric form and any associated mandrel or core can be placed in an apparatus that is used to introduce or inject resin into the fabric form (that is, if the fabric material is not already impregnated with resin) and the resin material is subsequently cured. Typically, during the later fabric application stages and the curing stage, there is some amount of dimensional shift in the part. Fortunately, by using the flexible circuit 32 to bridge the connector 28 and the conductive layer 30, the flexible circuit 32 can accommodate some of this dimensional shift, avoiding the need for custom-molded conductors or post-curing in-place attachment of the connectors directly to the conductive layer.

It should be appreciated that various other modifications and variations to the preferred embodiments can be made within the spirit and scope of the invention. Therefore, the invention should not be limited to the described embodiments. To ascertain the full scope of the invention, the following claims should be referenced.

What is claimed is:

1. A composite component comprising:
   a laminate body including a plurality of layers held together by a resin;
   an opening formed in the composite component;
   a connector received in the opening, the connector having a plug end that is accessible from an exterior of the composite component;
   a conductive layer disposed between the layers of the laminate body such that the conductive layer is embedded in the laminate body; and
   a flexible circuit that bridges the connector and the conductive layer, the flexible circuit placing the connector in electrical communication with the conductive layer;
   wherein at least a portion of an electrical circuit is established between the connector, the flexible circuit, and the conductive layer; and
   wherein the composite component is an engine vane.

2. The composite component of claim 1 wherein the flexible circuit is disposed between the layers of the laminate body and is flexible during a curing process in which the resin of the laminate body is hardened to form the composite component.

3. The composite component of claim 1 wherein the flexible circuit includes two conductive traces each connected to respective pins, in which each one of the two conductive traces electrically connects one of the pins on the connector to a respective portion of the conductive layer.

4. The composite component of claim 1 wherein the flexible circuit is welded to at least one of the connector and the conductive layer.

5. The composite component of claim 1 wherein the flexible circuit is soldered to at least one of the connector and the conductive layer.

6. The composite component of claim 1 wherein the plurality of layers of the laminate body are a carbon fiber fabric and are held together, at least in part, by a cured resin material.

7. The composite component of claim 1 wherein an insulative material is disposed between the laminate body and the conductive layer.

8. The composite component of claim 1 wherein the connector has an attachment end that is connected to the flexible circuit.

9. The composite component of claim 1 wherein the conductive layer is a heater element.

10. The composite component of claim 1 wherein the conductive layer includes one or more sensors adapted to monitor a structural health of the laminate body.

11. The composite component of claim 1 wherein the composite component is an airfoil.

12. The composite component of claim 1 wherein the opening for the connector is formed in a platform portion of the composite component adapted for connection to a case and the conductive material is formed in an airfoil portion of the composite component.

13. The composite component of claim 1 wherein the composite component further includes a core over which the plurality of layers of the laminate body are placed and wherein the opening that receives the connector is formed in the core, but the conductive layer is disposed between the layers of the laminate body.

14. A method of making a composite component having a laminate body including a plurality of layers having a conductive layer disposed there between and including a resin that holds the plurality of layers together, the method comprising:

laying at least some of the plurality of layers to form a portion of the laminate body;

placing a conductive layer and a flexible circuit in the laminate body and a connector in the composite component, in which the connector has a plug end that is accessible from an exterior of the composite component, the flexible circuit bridging the conductive layer and the connector and further placing the connector in electrical communication with the conductive layer;

laying a remainder of the plurality of layers to embed the conductive layer and the flexible circuit bridge within the laminate body; and curing the resin that holds the plurality of layers together to form the composite component;

wherein the plurality of layers of the laminate body are a carbon fiber fabric and are held together, at least in part, by a cured resin material.

15. The method of claim 14 wherein, during the curing process, the flexible circuit accommodates some spatial displacement of the connector and conductive material relative to one another.

16. The method of claim 14 further comprising the step of injecting the resin into the plurality of layers before curing.

17. The method of claim 14 further comprising the step of welding or soldering the flexible circuit to the connector and the conductive layer.

18. The method of claim 14 further comprising the steps of forming an opening in the composite component before laying the remainder of the plurality of layers and inserting the connector in the opening.

19. The method of claim 14 wherein the composite component further includes a core and the step of laying at least some of the plurality of layers to form a portion of the laminate body includes placing the layers over the core and wherein an opening that receives the connector is formed in the core, but the conductive layer is disposed between the layers of the laminate body.

20. A composite component comprising:

a laminate body including a plurality of layers held together by a resin;

an opening formed in the composite component;

a connector received in the opening, the connector having a plug end that is accessible from an exterior of the composite component;

a conductive layer disposed between the layers of the laminate body such that the conductive layer is embedded in the laminate body; and a flexible circuit that bridges the connector and the conductive layer, the flexible circuit placing the connector in electrical communication with the conductive layer;

wherein at least a portion of an electrical circuit is established between the connector, the flexible circuit, and the conductive layer;

wherein the plurality of layers of the laminate body are a carbon fiber fabric and are held together, at least in part, by a cured resin material.

\* \* \* \* \*